(12) United States Patent
Kim et al.

(10) Patent No.: US 6,757,338 B1
(45) Date of Patent: Jun. 29, 2004

(54) PREDISTORTION LINEARIZER USING EVEN ORDER INTERMODULATION COMPONENTS

(75) Inventors: Bumman Kim, Pohang-Shi (KR); Youngoo Yang, Pohang-Shi (KR); Young Yun Woo, Pohang-Shi (KR)

(73) Assignee: Postech Foundation, Kyungsangbuk-Do (KR)

( * ) Notice: Subject to any disclaimer, the term of this patent is extended or adjusted under 35 U.S.C. 154(b) by 604 days.

(21) Appl. No.: 09/670,217

(22) Filed: Sep. 25, 2000

(30) Foreign Application Priority Data

May 24, 2000 (KR) ........................................ 2000-27982

(51) Int. Cl.[7] .......................... H04K 1/02; H04L 25/03; H04B 1/04
(52) U.S. Cl. ..................... 375/296; 375/297; 455/114.3
(58) Field of Search ................................ 375/296, 297; 332/123, 125; 455/114.1, 114.2, 114.3, 127.1

(56) References Cited

U.S. PATENT DOCUMENTS

| | | | | |
|---|---|---|---|---|
| 4,992,754 A | * | 2/1991 | Blauvelt et al. | 330/149 |
| 6,313,701 B1 | * | 11/2001 | Mussino et al. | 330/149 |
| 6,538,509 B2 | * | 3/2003 | Ren | 330/149 |
| 6,693,974 B2 | * | 2/2004 | Jin et al. | 375/297 |

OTHER PUBLICATIONS

Kevin Morris, Peter Kenington, "Power Amplifier Linearization using Predistortion Techniques" IEE, Savoy Place, London, 1997.*
Jaehyok Yi, Youngoo Yang, Myungkyu Park, Wonwoo Kang and Bumman Kim, "Analog Predistortion Linearizer For High Power RF Amplifier" IEEE MTT–S Int. Microwave Sympo. Dig., Jun. 5, 2000, pp. 1511–1514.

* cited by examiner

Primary Examiner—Jean B. Corrielus
Assistant Examiner—Qutbuddin Ghulamali
(74) Attorney, Agent, or Firm—Katten Muchin Zavis Rosenman

(57) ABSTRACT

A predistortion linearizer for predistorting a radio frequency (RF) signal includes a power divider, an even order harmonics generator and a predistortion component producer. The power divider divides the RF signal into a first and a second RF signals. The even order harmonics generator, responsive to the second RF signal, generates one or more even order harmonics of the fundamental frequencies. And, the predistortion component producer produces one or more odd order harmonics from the fundamental frequencies and the even order harmonics to provide a predistorted RF signal including the fundamental frequencies and the odd order harmonics. The power divider divides the RF signal into first and second RF signals and delays the first RF signal.

11 Claims, 5 Drawing Sheets

PREDISTORTION LINEARIZER USING EVEN ORDER INTERMODULATION COMPONENTS

FIELD OF THE INVENTION

The present invention relates to a linearizer for predistorting a signal in order to compensate for non-linearities; and, in particular, to a predistortion linearizer capable of providing a predistorted signal through the use of even order intermodulation components.

DESCRIPTION OF THE PRIOR ART

Communications systems handling a single carrier usually employ high efficiency and low linearity amplifiers. Multi-carrier systems, however, require highly linear amplifiers at the expense of efficiency. An ideal amplifier would exhibit both perfect linearity and high efficiency.

Intermodulation distortion products are produced by non-linearities in amplifiers handling radio frequency(RF) signals such as the multiple carrier signals found in cellular telephone systems or in various other types of personal communications systems(PCS). Distortions can be caused by amplitude compressions or phase shifts that may occur in relatively large amplitude signals. The resulting spurious signals, when added to the spectrum of the information bearing signals, may degrade the quality of associated communications.

While the phenomena are fairly complex, the transfer function of an amplifier exhibiting non-linearities can be approximated by a Taylor series, that is, a polynominal with terms of the form $a_n x^n$. The first order effect ($a_1 x$) is the desired linear function. Distortion is caused by the second order term (square term), the third order term(cubic term), and so forth. For many high frequency systems, the even order terms produce harmonics that are out of the working bandwidth of a system and therefore can be readily discarded. Typically, only odd order (third, fifth, seventh, etc.) intermodulation products reside within the working spectrum of the system and thus are of a concern but with decreasing deleterious effects in that order.

Intermodulation distortion is highly undesirable because it causes interference, crosstalk, and other deleterious effects on the performance of a system employing a high power amplifier. One of the conventional approaches employed to counteract the distortion introduced by an amplifier involves predistortion of an input signal to the amplifier, wherein the input signal to the amplifier is predistorted in such a way that the intentionally added distortion effectively cancels out the distortion generated by the amplifier to thereby provide an undistorted output signal.

Referring to FIG. 1, there is illustrated a conventional predistortion circuit 50 for predistorting a RF signal, which includes two power dividers 10 and 12, an error amplifier 14, vector modulators 16 and 20, a signal canceler 18, a delay line 22 and a combiner 24.

The power dividers 10 and 12 sequentially divide an input RE signal having, e.g., two carriers into three RF signals RF1, RF2 and RF3. The error amplifier 14 amplifies the RF1 to generate a distorted RF signal having therein amplified carriers and intermodulation distortion components. The vector modulator 16 adjusts the amplitude and polarity (i.e., phase) of the RF2 in such a way that the adjusted RF signal has carriers whose amplitudes are substantially identical to those of the amplified carriers of the distorted RF signal, but with a 180 degree phase shift. At the signal canceler 18, the adjusted and the distorted RF signals are combined to extract the intermodulation distortion components. The vector modulator 20 varies the amplitudes and phase of the predistortion components extracted by the canceler 18. The delay line 22 serves to delay the RF signal RF3 to compensate for the time delay required in producing the predistortion components. The combiner 24 combines the delayed RF3 signal with the predistortion components to provide a main amplifier (not shown) with a predistorted RF signal having therein intentionally added distortion components to offset the distortion to be generated by the amplifier itself.

In the predistortion circuit described above, however, the predistortion components are not produced in an independently controlled manner. Therefore, The predistortion should be focused on the cancellation of the most deleterious intermodulation product, i.e., the third order component. Accordingly, if non-linear characteristics of an error amplifier for producing a predistorted signal and a main amplifier for amplifying the signal are different, which would be the case in general, higher order, e.g., fifth and seventh order, intermodulation products may not be effectively removed, deteriorating the overall performance of the system.

SUMMARY OF THE INVENTION

It is, therefore, an object of the present invention to provide a linearization circuit capable of providing independently controlled predistorting components.

In accordance with the present invention, there is provided a predistortion linearizer for predistorting a radio frequency(RF) signal having one or, more fundamental frequencies, comprising:

a divider for dividing the RF signal into a first and a second RF signals;

a generator, responsive to the second RF signal, for generating one or more even order harmonics of the fundamental frequencies; and a producer for producing one or more odd order harmonics from the fundamental frequencies and the even order harmonics to provide a predistorted RF signal including the fundamental frequencies and the odd order harmonics.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Preferred embodiments of the present invention will now be described with reference to predistortion linearizers for predistorting a dual tone RF signal having two fundamental carrier frequencies f1 and f2. It is to be understood, however, that the invention can be equally applicable to linearization of any signals having more than two tones. Moreover, the invention may also be used for predistortion of a single tone input signal in cases where a circuit component employed for the amplification of the input signal would otherwise tend to produce undesirable spurious signals.

Figure 1:
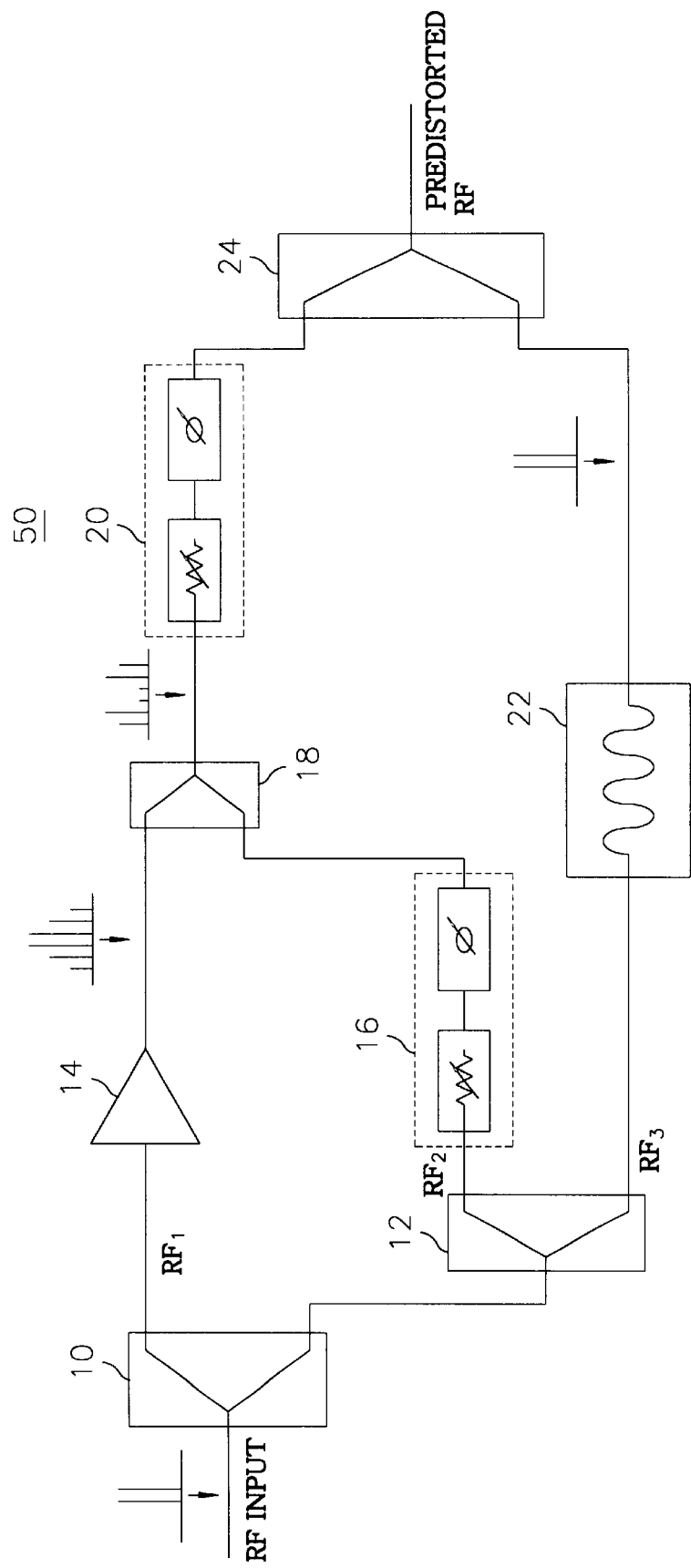
FIG. 1 shows a block diagram of a conventional predistortion linearizer.
Figure 2:
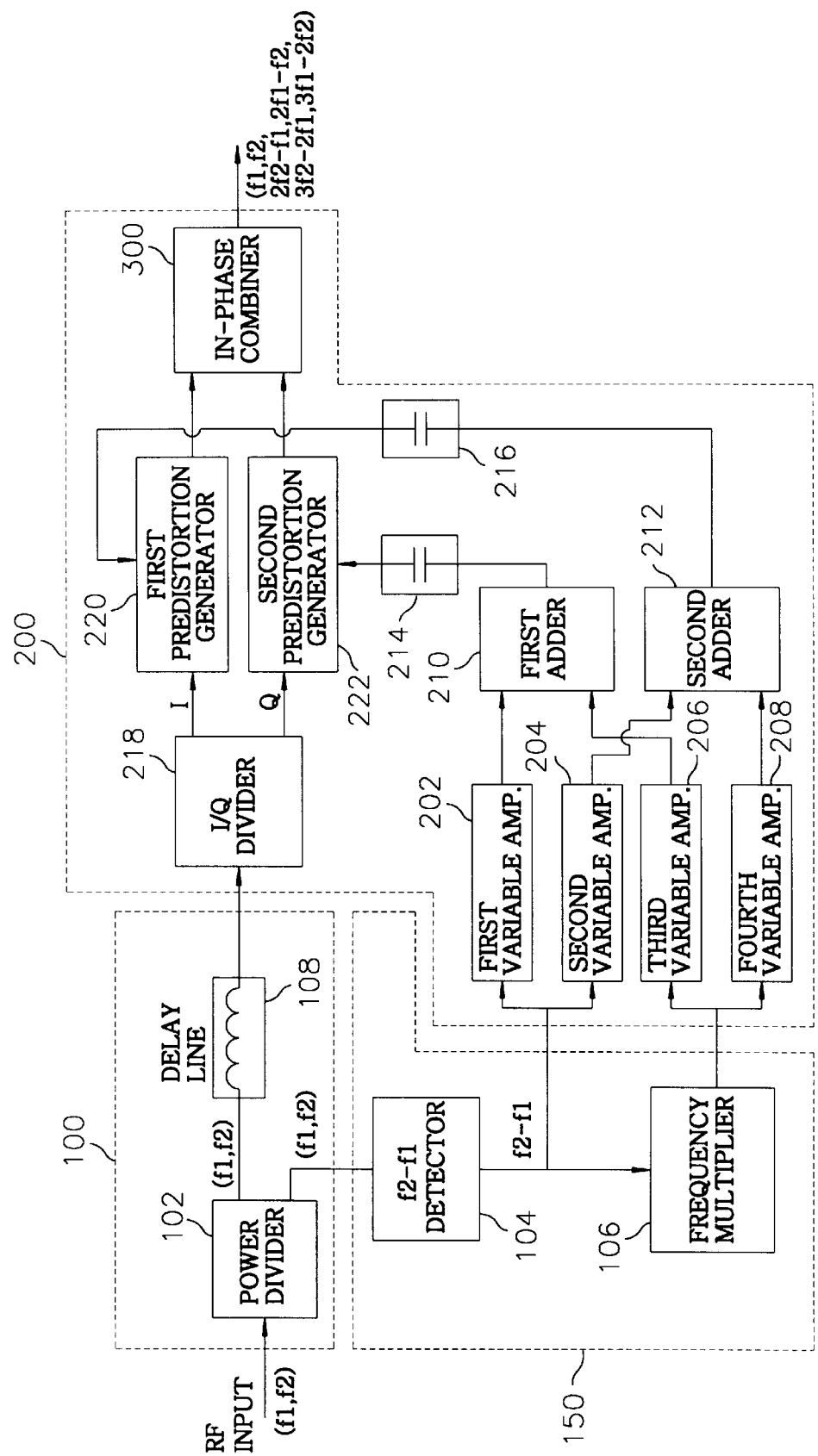
FIG. 2 depicts a block diagram of a predistortion linearizer in accordance with a preferred embodiment of the present invention.

Referring now to FIG. 2, there is illustrated a predistortion linearizer for predistorting a dual tone RF signal by using low frequency even order, i.e., second and fourth order, intermodulation components in accordance with a first embodiment of the present invention.

The first embodiment predistortion linearizer includes a power dividing section 100, even order harmonics generation section 150 and a predistorted signal generation section 200. The power dividing section 100 includes a power divider 102 and a delay line 108. The even order harmonics generation section 150 includes a f2–f1 detector 104 and a frequency multiplier 106. The predistorted signal generation section 200 includes an I/Q divider 218, variable amplifiers 202, 204, 206 and 208, adders 210 and 212, high pass filters 214 and 216, predistortion generators 220 and 222, and an in-phase combiner 300.

In the power dividing section 100, the power divider 102 divides an input RF signal having a dual-tone fundamental frequencies f1 and f2 into a first RF signal and a second RF signal. The delay line 108 delays the first RF signal to compensate for a time delay in the even order harmonics generation section 150.

In the even order harmonics generation section 150, the f2–f1 detector 104 detects a low frequency second order harmonic (intermodulation component) f2–f1 from the second RF signal and then outputs it to the first and the second variable amplifiers 202, 204 and the frequency multiplier 106. The frequency multiplier 106 performs frequency multiplication on the intermodulation component f2–f1 to generate a fourth order intermodulation component 2f2–2f1 to the third and the fourth variable amplifiers 206 and 208.

Figure 3:
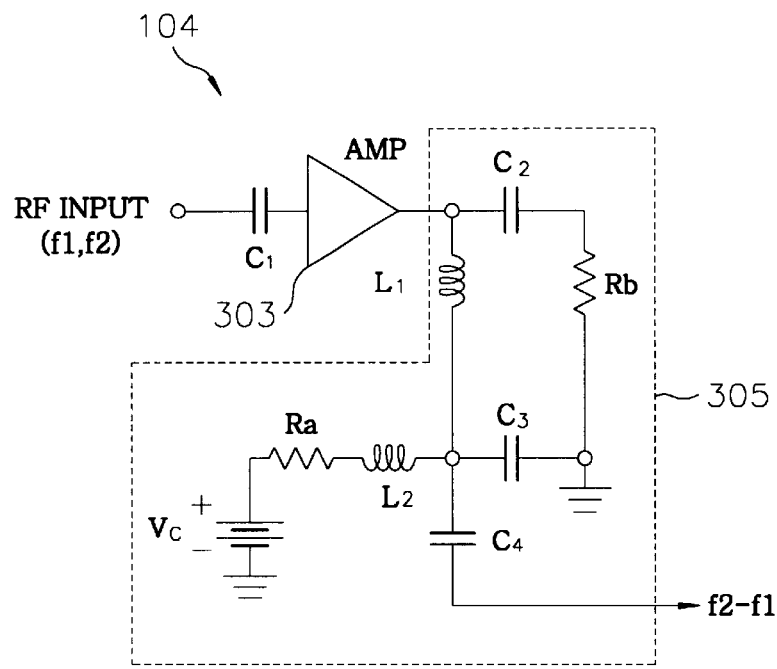
FIG. 3 illustrates a circuit diagram of a detector for generating a second order intermodulation component in accordance with the preferred embodiment of the present invention.

The detector 104, as shown in FIG.3, includes an input capacitor C1, a low power nonlinear amplifier 303, which generates intermodulation components from the second RF signal, and a filter 305 having elements C2, C3, C4, L1, L2, Ra, Rb and Vc. The nonlinear amplifier 303 amplifies the second RF signal to generate the intermodulation components; and the filter 305 serves to filter out other intermodulation components than a low frequency second order component f2–f1. The detected second order intermodulation component f2–f1 is inputted to the first and the second variable amplifiers 202, 204 and the frequency multiplier 106. The second order intermodulation component f2–f1 inputted to the frequency multiplier 106 is converted to a fourth order intermodulation component 2f2–2f1 by frequency multiplication.

The I/Q divider 218 divides the delayed RF signal into an in-phase (I) component and a quadrature (Q) component thereof the I and the Q components of the RF signals are provided to the first and the second predistortion generators 220 and 222, respectively.

The first and the second variable amplifiers 202, 204 independently amplifies an amplitude and shifts a phase of the second order component to generate a first-adjusted and a second-adjusted second order intermodulation components, respectively. Similarly, the third and the fourth variable amplifiers 206, 208 independently amplifies an amplitude and shifts a phase of the fourth order intermodulation component to thereby generate a first-adjusted and a second-adjusted fourth order intermodulation components, respectively. Each of the output intermodulation components from the amplifiers 202–208 has a variable amplitude with a phase shift of 0 degree or 180 degrees determined depending on, e.g., the polarity of a control voltage applied to its corresponding amplifier.

The first adder 210 adds the first-adjusted second order intermodulation component and the first-adjusted fourth order intermodulation component to thereby generate a first even order intermodulation components. The second adder 212 adds the second-adjusted second order intermodulation component and the second-adjusted fourth order intermodulation component to thereby generate a second even order intermodulation components. The high pass filters 214, 216 eliminate DC components of the first and the second even order intermodulation components, respectively.

The first predistortion generator 220 modulates the I component of the RF signal with the second filtered even order intermodulation components to generate an in-phase predistorted RF signal including the I component of the RF signal and a first set of third and fifth order intermodulation components. The second predistortion generator 222 modulates the Q component of the RF signal with the first filtered even order intermodulation components to generate a quadrature predistorted RF signal including the Q component of the RF signal and a second set of third and fifth order intermodulation components.

Figure 4:
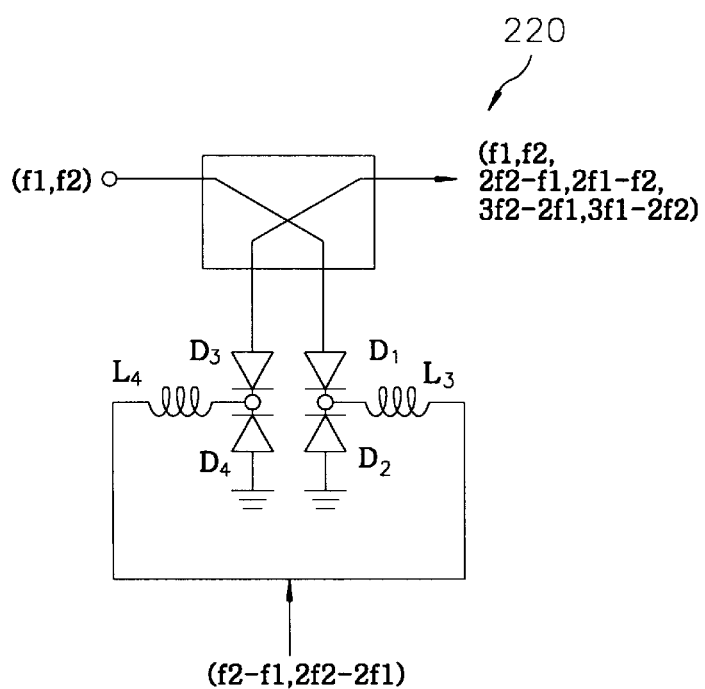
FIG. 4 provides a predistortion generator for coupling a RF signal with even order intermodulation components to generate a predistorted RF signal having odd order predistortion components in accordance with the preferred embodiment of the present invention.

Referring to FIG. 4, there is provided an exemplary circuit diagram of the first predistortion generator 220 for coupling the I component of the RF signal with the second filtered even order intermodulation components to generate the in-phase predistorted RF signal. The predistortion generator 220 constructed by using a nonlinear mixer or a diode-coupled hybrid coupler having diodes D1–D4 and inductors L3, L4 as shown in the drawing. The predistortion generator 220 generates I components of f1, f2 and a first set of third order intermodulation components 2f2–f1, 2f1–f2 and fifth order intermodulation components 3f2–2f1, 3f1–2f2. The odd order intermodulation components are generated within the working bandwidth of the RE signal f1, f2 by a nonlinear characteristic of the diodes D1 to D4. The amplitude and the phase of an odd order intermodulation component are determined by the product of the amplitudes and the sum of the phases of a corresponding fundamental component, f1 or f2, and a corresponding even order intermodulation component, i.e., f2–f1 or 2f2–2f1. The second predistortion generator 222 is constructed and functions in an identical manner as in the first predistortion generator 220.

The in-phase combiner 300 combines the in-phase and the quadrature predistorted RF signals from the first and the second predistortion generators 220, 222 to thereby output a combined predistorted RF signal to a power amplifier (not shown) serving to amplify the predistorted RF signal applied thereto. In accordance with the present invention, each of the odd order intermodulation components included in the combined predistorted RF signal can be controlled independently to have any desired amplitude and phase in such a way, that the intermodulation components of the predistorted RF signal can effectively cancel intermodulation distortion components to be produced by the main amplifier.

Figure 5A:
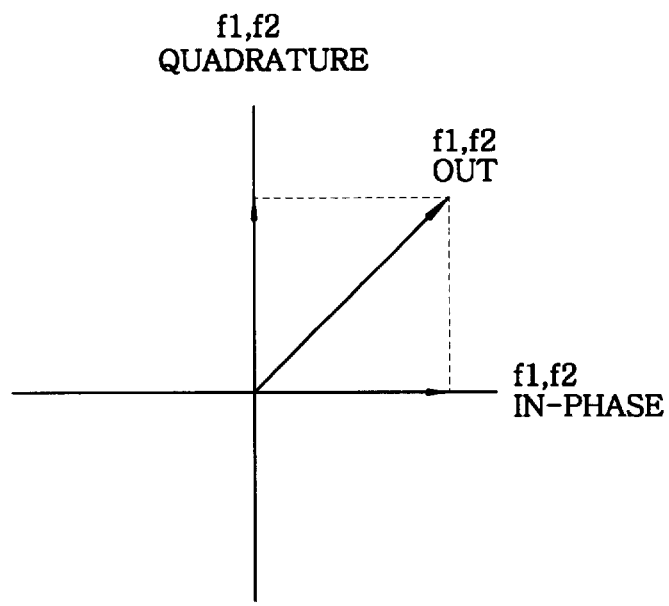
FIGS. 5A and 5B represent phase diagrams explaining in-phase and quadrature components of fundamental frequencies f1, f2 and third order intermodulation components 2f2–f1 and 2f1–f2.
Figure 5B:
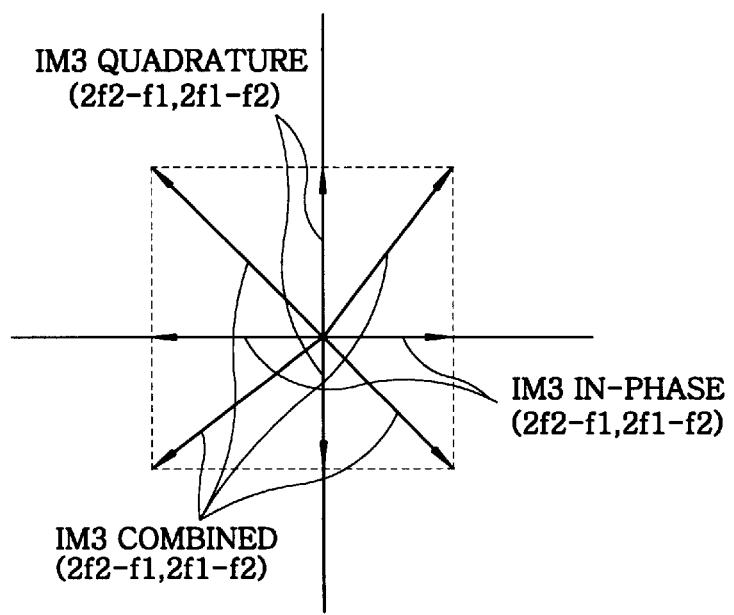

Referring now to FIGS. 5A and 5B, there are illustrated phase diagrams explaining the predistorted RF signal generation process of the present invention in further detail. As shown in FIG. 5A, each of the fundamental components f1, f2 of the RF signal is divided into an I and a Q components having a phase difference of 90 degrees at the I/Q divider 218; and at the in-phase combiner 300 the I and the Q components of f1 and f2 are respectively recombined as f1 and f2 without incurring any significant or noticeable changes in their amplitudes and phases.

As described above, the even order intermodulation components are controlled independently to have any desired amplitudes with phase shift of 0 degree or 180 degrees at the variable amplifiers 202–208. These even order intermodulation components thus produced are operated against the I and Q components of the fundamental frequencies f1, f2 to generate the in-phase and the quadrature odd order intermodulation components at the predistortion generator 220, 222. The amplitude and the phase of an odd order intermodulation component are the product of the amplitudes and the sum of the phases an I or Q component of a fundamental frequency and an even order intermodulation component. Therefore, each of the in-phase and the quadrature odd order intermodulation components can be controlled to have any desired amplitude with a phase shifted 0 degree or 180 degrees with reference to the phase of a corresponding I or Q component of a fundamental frequency f1 or f2. The in-phase and the quadrature odd order intermodulation components thus produced are then combined at the in-phase combiner 300 as shown in FIG. 5B, wherein the phase combination process is exemplary shown in terms of the third order intermodulation components of 2f2–f1 and 2f1–f2. As shown in the drawing, in-phase third order components (IM3 in-phase) can have any arbitrary amplitudes lying on the horizontal in-phase axis (0 degree or 180 degree phase shift). Similarly, quadrature third order components (IM3 quadrature) can have any amplitudes on the vertical quadrature axis (0 degree or 180 degree phase shift) as discussed hereinabove. The in-phase components and their corresponding quadrature components are combined at the in-phase combiner 300 to generate combined odd order intermodulation components. As can be seen from the drawing, the combined odd order components can have any amplitudes with varying phases. In accordance with the present invention, therefore, it is possible to generate a predistorted RF signal having odd order intermodulation components independently controlled to have any desired amplitudes and phases capable of effectively canceling out intermodulation distortion components to be produced by the main amplifier.

Figure 6:
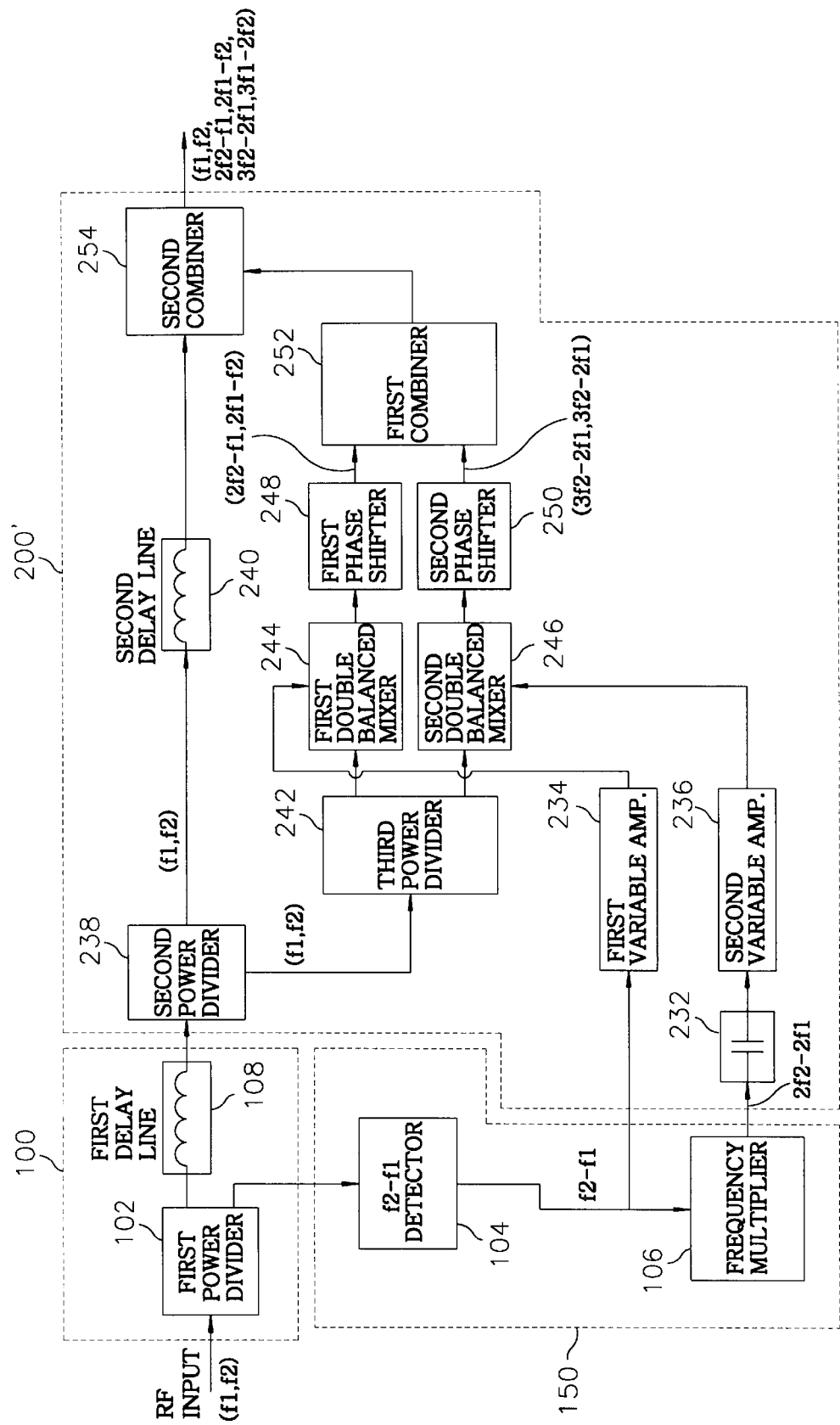
FIG. 6 presents a block diagram of a predistortion linearizer in accordance with another preferred embodiment of the present invention.

Referring now to FIG. 6, there is provided a block diagram of a predistortion linearizer in accordance with a second preferred embodiment of the present invention. The structures and functions of a RF dividing section 100 and an even order harmonics generation section 150 in FIG. 6 are identical to those of the first preferred embodiment shown in FIG. 2.

A predistorted signal generation section 200' includes a second and a third power dividers 238 and 242, a high pass filter 232, a first and a second variable amplifiers 234 and 236, a second delay line 240, a first and a second double balanced mixers 244 and 246, a first and a second phase adjusters 248 and 250, and a first and a second combiners 252, 254.

The second power divider 238 divides the RF signal from the first delay line 108 into a first and a second divided RF signals. The first divided RE signal is provided to the second combiner 254 through the second delay line 240. The delay line 240 serves to compensate a time delay in the power divider 242, mixers 244 and 246, the phase shifters 248 and 250, and the first combiner 252. The third power divider 242 divides the second divided RF signal into a third and a fourth divided RF signals. The high pass filter 232 filters out a DC component of the fourth order intermodulation component 2f2–2f1 from the frequency multiplier 106. The first variable amplifier 234 amplifies the amplitude of the low frequency second order intermodulation component f2–f1 from the f2–f1 detector 104. The second variable amplifier 236 amplifies the amplitude of the low frequency fourth order intermodulation component 2f2–2f1 from the filter 232.

The first double balanced mixer 244 mixes the third divided RF signal and the amplified second order intermodulation component f2–f1 to thereby provide third order intermodulation components 2f2–f1, 2f1–f2 to the first phase shifter 248, wherein the fundamental components f1, f2 of the RE signal are removed from the output of the mixer 244 by an isolation characteristic thereof. The second double balanced mixer 246 mixes the fourth divided RF signal and the amplified fourth order intermodulation component 2f2–2f1 to thereby provide fifth order intermodulation components 3f2–2f1, 3f1–2f2 to the second phase shifter 250, wherein the fundamental components f1, f2 are also removed from the output of the mixer 246.

The first and the second phase shifters 248, 250 adjust the phases of the third and the fifth order intermodulation components, respectively. The first combiner 252 combines the phase adjusted third and the fifth order intermodulation components to thereby provide the third and the fifth order intermodulation components together to the second combiner 254.

The second combiner 254 combines the first divided RF signal through the second delay line 240 with the output of the first combiner 252 to thereby generate a predistorted RF signal having therein the fundamental components f1 and f2 and the independently controlled third and fifth order intermodulation components as in the first embodiment of the present invention.

In the predistortion linearizer of the second embodiment, the amplitudes of the third and the fifth intermodulation components are independently controlled to have desired values by adjusting the amplitudes of the second and the fourth intermodulation components at the respective variable amplifiers 234 and 236. Similarly the phases of the third and the fifth intermodulation components are independently controlled to have any desired values at the phase shifters 248 and 250.

While the invention has been shown and described with respect to the preferred embodiments, it will be understood by those skilled in the art that various changes and modifications may be made without departing from the spirit and scope of the invention as defined in the following claims.

What is claimed is:

1. A predistortion linearizer for predistorting a radio frequency(RF) signal having one or more fundamental frequencies, comprising:

means for dividing the RF signal into a first and a second RF signals;

means, responsive to the second RF signal, for generating one or more even order intermodulation components of the fundamental frequencies; and means for producing one or more odd order intermodulation components from the fundamental frequencies and the even order intermodulation components to provide a predistorted RF signal including the fundamental frequencies and the odd order intermodulation components.

2. The predistortion linearizer of claim 1, wherein the number of the even order intermodulation components is two.

3. The predistortion linearizer of claim 2, wherein the generating means includes:
   means for detecting a first even order intermodulation component; and
   means for obtaining a second even order intermodulation component from the first even order intermodulation component.

4. The predistortion linearizer of claim 3, wherein the producing means includes;
   means for dividing the first RF signal into an in-phase component and a quadrature component thereof;
   means for providing a first and a second sets of an amplified first and an amplified second even order intermodulation components;
   a first modulating means for modulating the in-phase component and the first set of even order intermodulation components to generate an in-phase signal having al in-phase component and a first set of odd order intermodulation components;
   a second modulating means for modulating the quadrature component and the second set of even order intermodulation components to generate a quadrature signal having a quadrature component and a second set of odd order intermodulation components; and
   means for combining the in-phase signal and the quadrature signal to generate a predistorted RF signal.

5. The predistortion linearizer of claim 4, wherein the first and the second even order intermodulation components are a second and a fourth order intermodulation components, respectively.

6. The predistortion linearizer of claim 5, wherein the odd order intermodulation components of the first and the second sets are a third and a fifth order intermodulation components.

7. The predistortion linearizer of claim 6, wherein the means for providing the first and the second sets includes means for independently controlling amplitudes of the even order intermodulation components of the first and the second sets to have values different from each other.

8. The predistortion linearizer of claim 7, wherein each of the even order intermodulation components of the first and the second sets has a phase shift of 0 degree or 180 degrees.

9. The predistortion linearizer of claim 3, wherein the producing means includes:
   means for dividing the first RF signal into a third and a fourth RF signals;
   means for dividing the forth RF signal into a fifth and a sixth RF signals;
   means for independently amplifying the first and the second even order intermodulation components to thereby generate a first and a second amplified even order intermodulation components;
   means for generating a first odd order intermodulation component from the fifth RF signal and the first amplified even order intermodulation component;
   means for generating a second odd order intermodulation component from the sixth RF signal and the second amplified even order intermodulation component;
   means for adjusting phases of the first and the second odd order intermodulation components;
   means for providing combined odd order intermodulation components from the phase adjusted first and second odd order intermodulation components; and
   means for combining the third RF signal with the coupled odd order intermodulation components to thereby provide a predistorted RF signal.

10. The predistortion linearizer of claim 9, wherein the first and the second even order intermodulation components are a second and a fourth order intermodulation components.

11. The predistortion linearizer of claim 10, wherein the first and the second odd order intermodulation components are a third and a fifth order intermodulation components.

* * * * *